(12) United States Patent  
Lan

(10) Patent No.: US 7,782,619 B2
(45) Date of Patent: Aug. 24, 2010

(54) HEAT SINK PROTECTIVE COVER

(75) Inventor: Wen-Ji Lan, Sinjhuang (TW)

(73) Assignee: Asia Vital Components Co., Ltd., Taipei County (TW)

( * ) Notice: Subject to any disclaimer, the term of this patent is extended or adjusted under 35 U.S.C. 154(b) by 42 days.

(21) Appl. No.: 12/354,359

(22) Filed: Jan. 15, 2009

(65) Prior Publication Data

US 2010/0177481 A1    Jul. 15, 2010

(51) Int. Cl.
*H05K 7/20* (2006.01)
(52) U.S. Cl. .................. 361/704; 361/679.54; 361/705; 361/708; 361/709; 361/710; 165/80.3; 165/104.33; 165/185; 206/527; 206/587; 206/701; 206/722
(58) Field of Classification Search ............ 361/679.46, 361/679.54, 700–712, 715, 717–724; 165/80.2, 165/80.3, 80.4, 80.5, 104.33, 104.34, 185; 257/706–727; 174/15.1, 16.3, 252; 206/527, 206/587, 701, 702, 718, 722, 822
See application file for complete search history.

(56) References Cited

U.S. PATENT DOCUMENTS

| | | | | |
|---|---|---|---|---|
| 6,049,458 A * | 4/2000 | Lee et al. | ..................... | 361/705 |
| 6,871,701 B2 | 3/2005 | Ueki et al. | | |
| 6,935,420 B1 * | 8/2005 | Dong et al. | .................. | 165/185 |
| 7,051,790 B2 * | 5/2006 | Lin | ........................... | 165/80.2 |
| 7,063,136 B2 * | 6/2006 | Yu et al. | ...................... | 165/185 |
| 7,068,514 B2 * | 6/2006 | Chang et al. | ................. | 361/705 |
| 7,319,592 B2 * | 1/2008 | Wang et al. | .................. | 361/705 |
| 7,349,210 B2 * | 3/2008 | Sheng et al. | ................ | 361/695 |
| 7,365,983 B2 * | 4/2008 | Huang et al. | ................ | 361/704 |
| 7,441,593 B2 * | 10/2008 | Wu | ............................. | 165/185 |
| 7,589,969 B2 * | 9/2009 | Wang et al. | .................. | 361/705 |
| 7,623,350 B2 * | 11/2009 | Tien et al. | .................... | 361/719 |
| 2009/0231814 A1 * | 9/2009 | Liao et al. | .................... | 361/704 |

* cited by examiner

*Primary Examiner*—Michael V Datskovskiy

(57) ABSTRACT

A heat sink protective cover includes a main body, on which at least one receiving space is defined for receiving a heat sink therein. The receiving space includes at least one positioning section and a dust-proof section. The positioning section is located at two opposite inner wall surfaces of the receiving space. The dust-proof section includes a raised portion and a recess portion, the raised portion is extended along a periphery of the dust-proof section to limit the recess portion on four sides thereof, and the dust-proof section is located on a bottom of the receiving space. The heat sink is stably hold in place in the receiving space by the positioning section and isolated from dust by the dust-proof section, and can therefore be effectively protected against collision, damage, and contamination while being transported.

9 Claims, 6 Drawing Sheets

HEAT SINK PROTECTIVE COVER

FIELD OF THE INVENTION

The present invention relates to a protective cover, and more particularly to a protective cover for protecting a heat sink against collision, damage, and dust in the process of transport thereof.

BACKGROUND OF THE INVENTION

With the constant development in the electronic information industry, many heat-producing electronic elements, such as a central processing unit (CPU), also have constantly increased operating speed and frequency now. As a result, these electronic elements produce more heat and have constantly raised temperature to thereby seriously threaten the performance thereof. To ensure normal operation thereof, the heat-producing electronic element usually has a heat sink mounted on a surface thereof for timely carry away the high amount of produced heat. Meanwhile, to reduce a contact thermal resistance between the heat sink and the heat-producing electronic element, a thermal medium is usually applied to a bottom of the heat sink, so that the heat sink indirectly contacts with the electronic element via the thermal medium.

Since the thermal medium fills the clearance between the heat sink and the electronic element, heat produced by the electronic element is conducted to the heat sink via the thermal medium and then dissipates into ambient environment through convection. However, the thermal medium applied to the bottom of the heat sink is subject to scratch by other elements or contamination by dust when the heat sink is transported from one place to another place or is assembled to the electronic element, resulting in largely reduced heat conduction between the assembled heat sink and electronic element due to the scratched or contaminated thermal medium.

A conventional heat sink protective cover is attached to the bottom of the heat sink via bonding means provided on part of the protective cover, so as to cover and protect the thermal medium applied on the bottom of the heat sink against scratch or contamination.

That is, to attach the protective cover to the bottom of the heat sink to cover the thermal medium thereat, it is necessary to manually provide a bonding means on the protective cover first, such as adhesive tape or double-sided tape, to ensure firm connection of the protective cover to the heat sink. By doing this, a lot of labor is required to increase the cost of the heat sink. Moreover, in the process of transporting or assembling the heat sink, the protective cover tends to separate from the vibrating or moving heat sink due to insufficient bonding strength of the adhesive tape, and accordingly results in scratched or contaminated thermal medium, which would further result in largely reduced heat conducting effect between the heat sink and the electronic element. In a worse condition, the electronic element might become damaged due to poor heat dissipation thereof. In brief, the conventional heat sink protective cover has the following disadvantages: (1) failing to stably hold the heat sink in place and tending to separate from the heat sink; (2) failing to provide any dust-preventing effect; and (3) failing to protect the thermal medium against scratch or contamination.

It is therefore tried by the inventor to overcome the above-mentioned problems by developing an improved heat sink protective cover.

SUMMARY OF THE INVENTION

A primary object of the present invention is to provide a heat sink protective cover with enhanced dust-preventing effect.

Another object of the present invention is to provide a heat sink protective cover with enhanced positioning effect.

To achieve the above and other objects, the heat sink protective cover according to the present invention includes a main body, on which at least one receiving space is defined for receiving a heat sink therein. The receiving space includes at least one positioning section and a dust-proof section. The dust-proof section is located on a bottom of the receiving space and includes a raised portion and a recess portion, the raised portion is extended along a periphery of the dust-proof section to limit the recess portion on four sides thereof. The positioning section is located at two opposite inner wall surfaces of the receiving space. The heat sink is stably hold in place in the receiving space by the positioning section and isolated from dust by the dust-proof section, and can therefore be effectively protected against collision, damage, and contamination while being transported.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
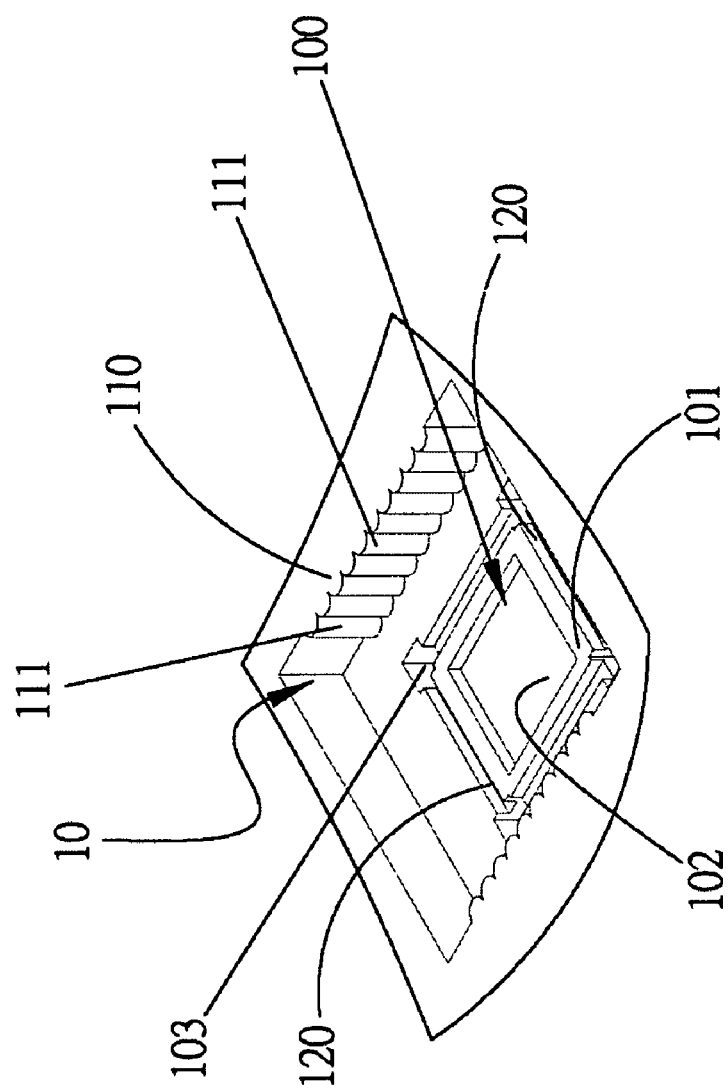
FIG. 1 shows an individual receiving space provided on a heat sink protective cover of the present invention.
Figure 2:
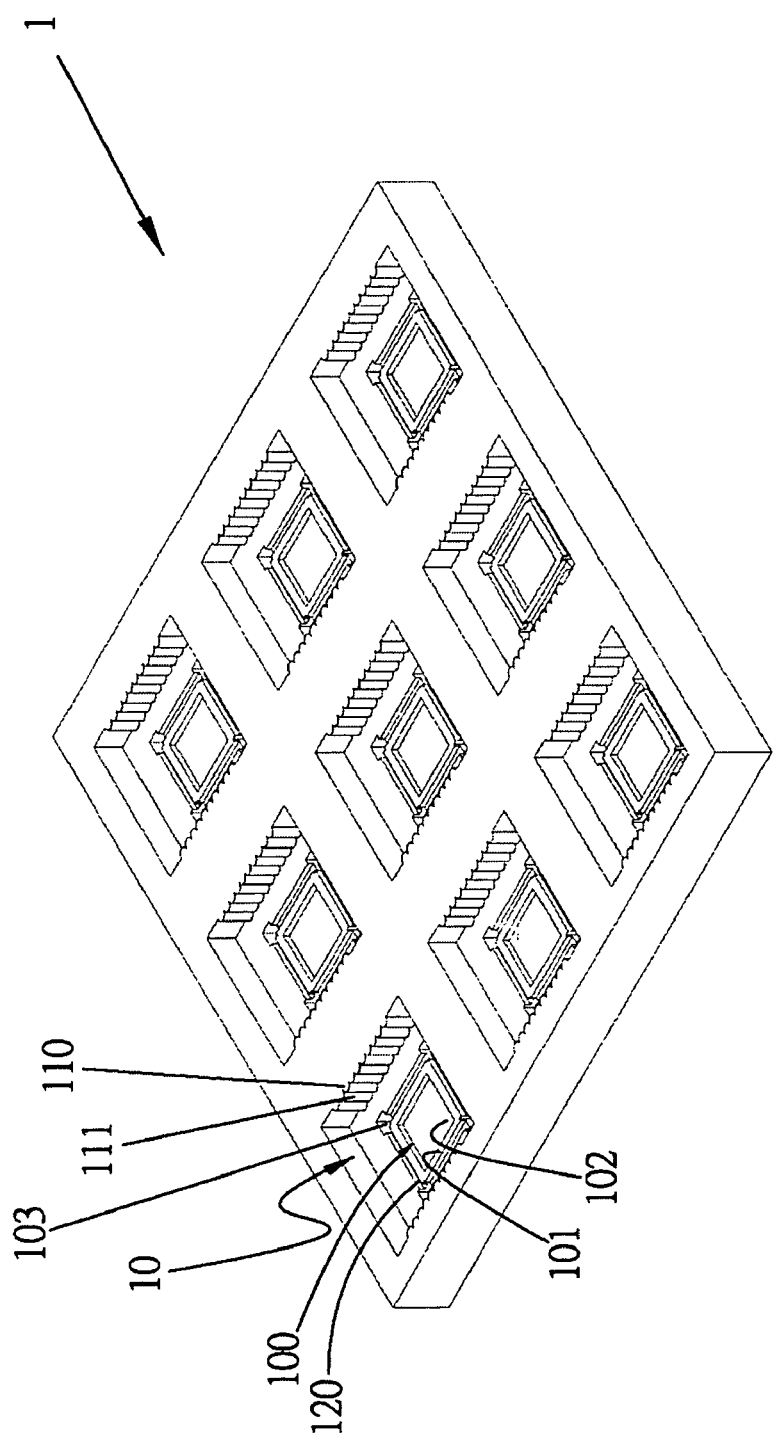
FIG. 2 is a perspective view of a heat sink protective cover according to an embodiment of the present invention.

Please refer to FIGS. 1 and 2. A heat sink protective cover according to the present invention includes a main body 1, on which at least one receiving space 10 is defined. In the illustrated embodiment, there are nine (9) receiving spaces 10. Each of the receiving spaces 10 can hold one heat sink 2 therein, and includes a dust-proof section 100 and at least one positioning section 110. The positioning section 110 is located at two opposite inner wall surfaces of the receiving space 10. The dust-proof section 100 includes a raised portion 101 and a recess portion 102. The raised portion 101 is extended along an outer periphery of the dust-proof section 100 to limit the recess portion 102 on four sides, and the dust-proof section 100 is located on a bottom of the receiving space 10.

Figure 3:
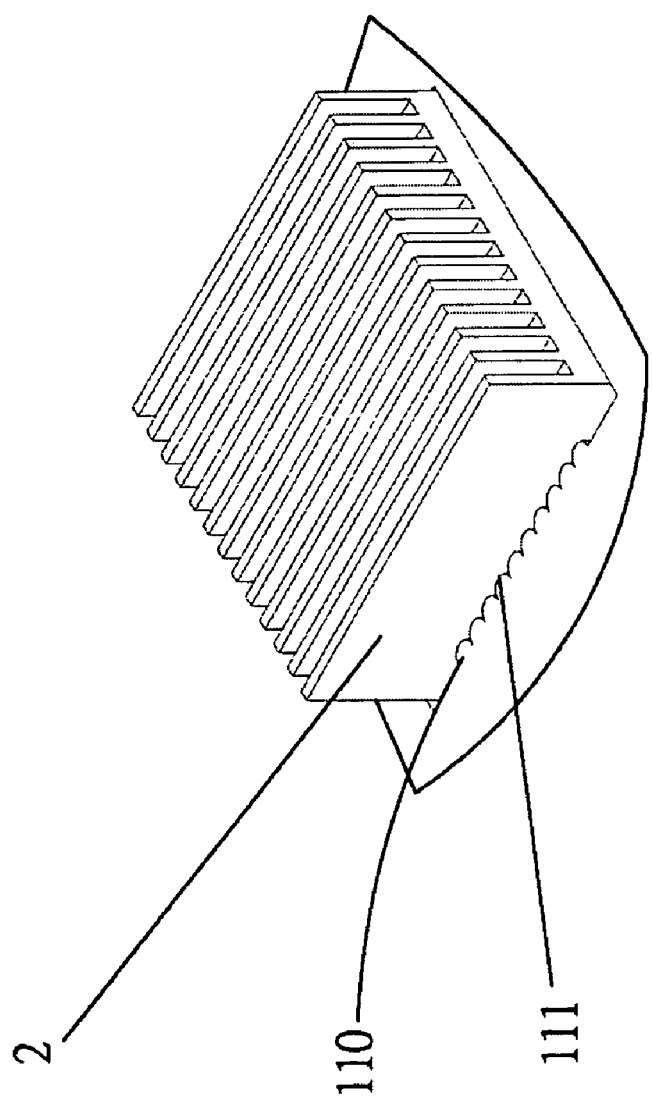
FIG. 3 shows a heat sink disposed in one receiving space on the heat sink protective cover of the present invention.

Please refer to FIG. 3. The positioning section 110 stably holds the heat sink 2 at two opposite sides thereof, so that the heat sink 2 can be fixedly positioned in the receiving space 10 without the risk of separating therefrom while being transported or moved from one place to another place. The dust-proof section 100 functions to protect an external contact face 21 on the heat sink 2. The contact face 21 is to be closely contacted with a heat-producing unit (not shown). The heat-producing unit can be, for example, a central processing unit (CPU). With the positioning section 110 and the dust-proof section 100, the heat sink 2 can be safely disposed in the receiving space 10 of the protective cover and effectively protected against undesirable movement and dust. Thus, the heat sink 2 is well positioned in the protective cover without being subjected to collision and damage in the process of transport thereof.

Figure 5A:
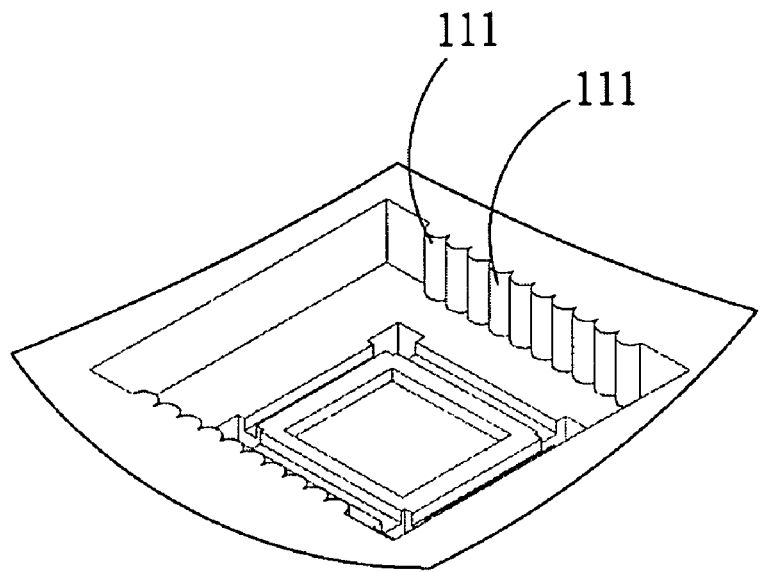
FIG. 5A shows a first arrangement of positioning ribs on the heat sink protective cover of the present invention.
Figure 5B:
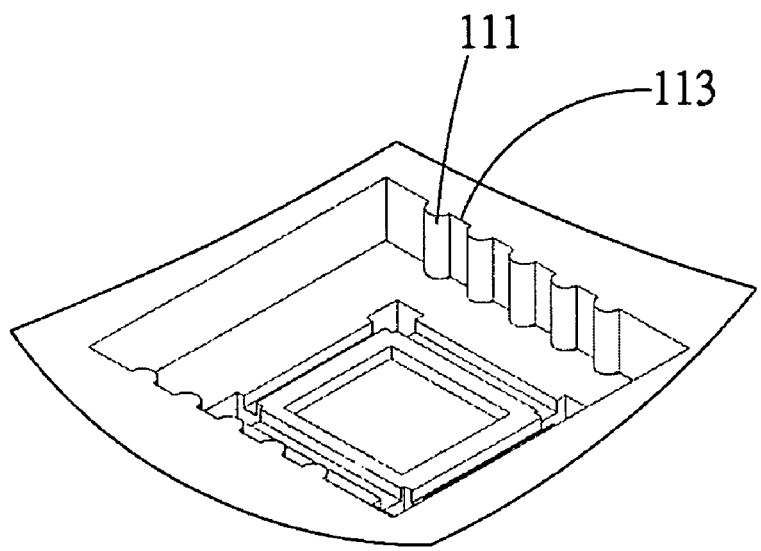
FIG. 5B shows a second arrangement of positioning ribs on the heat sink protective cover of the present invention.

The main body 1 of the protective cover can be made of a material with plasticity, such as plastics or other plastic materials, and can be formed by stamping or injection molding the plastic materials. In other words, the main body 1 is integrally formed. The positioning section 110 includes at least a pair of opposite positioning ribs 111 protruded toward each other. In the case of having two or more positioning ribs 111 at each of the two opposite inner wall surfaces of the receiving space 10, the positioning ribs 111 can be successively arranged side by side or equally spaced. In the case of being successively arranged side by side, the positioning ribs 111 are closely adjacent to one another without leaving any space between any two of them, as shown in FIG. 5A. Or, in the case of being equally spaced, any two adjacent ones of the positioning ribs 111 are spaced from each other by a distance 113, as shown in FIG. 5B. The positioning ribs 111 can have a semicircular, a square, or a half-oval cross sectional shape.

Figure 4:
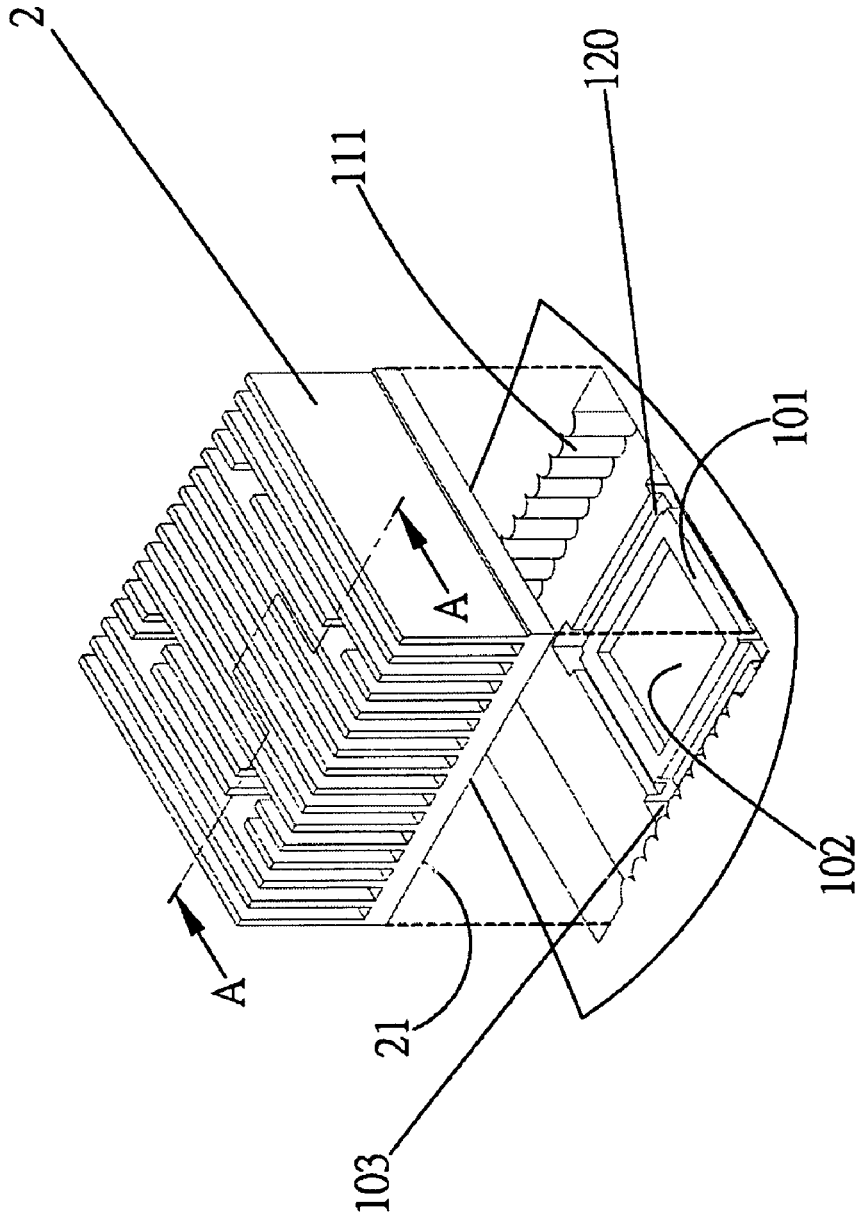
FIG. 4 is an exploded view of FIG. 3 showing the heat sink is separated from the receiving space on the heat sink protective cover.
Figure 4A:
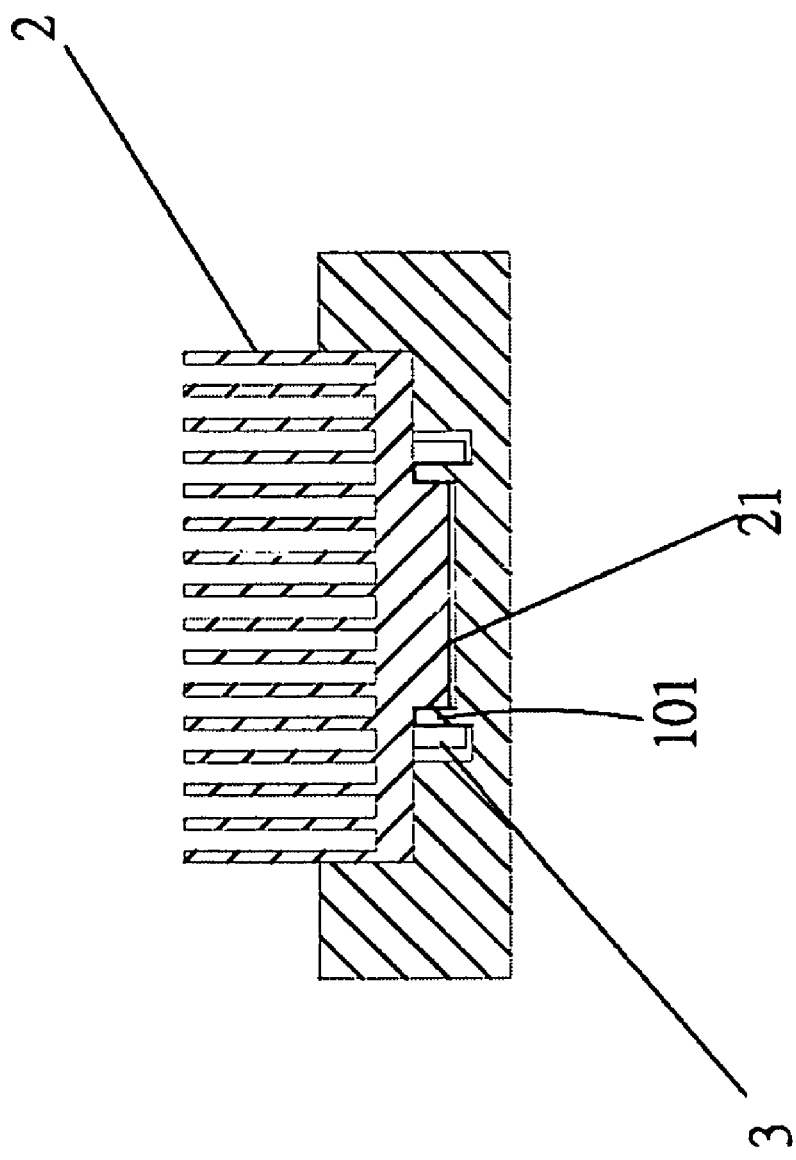
FIG. 4A is a cross-sectional view taken along line A-A of FIG. 4.

Please refer to FIGS. 4 and 4A along with FIGS. 1, 2, and 3. The receiving space 10 further includes at least one channel section 120 for barring dust from the main body 1. In the illustrated embodiment, there are four channel sections 120 directly located at an outer side of the raised section 101. At each joint of two adjacent channel sections 120, there is formed a stop hole 103, which communicates two channel sections with each other, and is deeper than the recess portion 102 without downward penetrating through the main body 1.

As can be seen from FIGS. 4 and 4A, the stop holes 103 are provided for each receiving a fastener 3 of the heat sink 2. When being confined in the stop holes 103, the fasteners 3 are not subject to separation from the heat sink 2 due to vibration. The fasteners 3 can be, for example, screws.

To reduce the contact thermal resistance between the contact face 21 and the heat-producing unit, a thermal medium, such as a heat-dissipating paste, is applied on the contact face 21 of the heat sink 2, so that the heat sink 2 indirectly contacts with the heat-producing unit via the thermal medium. After the thermal medium has been applied on the contact face 21 of the heat sink 2, the heat sink 2 is disposed in the receiving space 10. At this point, a bottom of the heat sink 2 is abutted on the raised portion 101 of the dust-proof section 100 and the contact face 21 is covered by the recess portion 102, protecting the thermal medium against scratch or dust contamination.

To use the heat sink protective cover of the present invention, first dispose a heat sink 2 in one of the receiving spaces 10, and apply a downward force against the heat sink 2. At this point, the main body 1 is temporarily deformed in its configuration under the external force applied thereto, allowing the positioning ribs 111 to successfully clamp the heat sink 2 at two opposite sides thereof. Meanwhile, the fasteners 3 and the contact face 21 of the heat sink 2 are fitly received in the stop holes 103 and the recess portion 102 of the dust-proof section 100, respectively, making the heat sink 2 stably disposed in the receiving space 10 without the risk of easily separating therefrom or being contaminated by dust while being transported or moved.

When it is desired to remove the heat sink 2 from the receiving space 10 of the main body 1, simply apply an upward force against the heat sink 2 being stably disposed in the receiving space 10. At this point, the main body 1 is temporarily deformed in its configuration under the external force applied thereto, so that the positioning ribs 111 no longer clamp the two opposite sides of the heat sink 2 to allow removal of the heat sink 2 from the main body 1. Therefore, the heat sink 2 can be easily assembled to and disassembled from the main body 1.

In brief, the heat sink protective cover of the present invention has the following advantages: (1) stably holding the heat sink in place without easily separating therefrom; (2) giving enhanced dust-protecting effect; (3) enabling easy assembly and disassembly of the heat sink to and from the protective cover; and (4) protecting the thermal medium against scratch and contamination.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A heat sink protective cover, comprising a main body, on which at least one receiving space is defined for receiving a heat sink therein; the receiving space including at least one positioning section and at least one dust-proof section; the positioning section being located at two opposite inner wall surfaces of the receiving space; the dust-proof section including a raised portion and a recess portion, the raised portion being extended along a periphery of the dust-proof section to limit the recess portion on four sides thereof; and the dust-proof section being located on a bottom of the receiving space.

2. The heat sink protective cover as claimed in claim 1, wherein the receiving space further includes at least one channel section directly located at an outer side of the raised section.

3. The heat sink protective cover as claimed in claim 2, wherein, a stop hole is formed at each joint of two adjacent channel sections to communicate the two channel sections with each other.

4. The heat sink protective cover as claimed in claim 1, wherein the positioning section includes at least a pair of two opposite positioning ribs, which are protruded toward each other.

5. The heat sink protective cover as claimed in claim 4, wherein, in the case of having two or more positioning ribs provided on each of the two opposite inner wall surfaces of the receiving space, the positioning ribs are successively arranged side by side without leaving any space between any two adjacent positioning ribs.

6. The heat sink protective cover as claimed in claim 4, wherein, in the case of having two or more positioning ribs provided on each of the two opposite inner wall surfaces of the receiving space, the positioning ribs are equally spaced with a predetermined distance left between any two adjacent positioning ribs.

7. The heat sink protective cover as claimed in claim 4, wherein the positioning ribs have a cross-sectional shape selected from the group consisting of a semicircular shape, a square shape, and a half-oval shape.

8. The heat sink protective cover as claimed in claim 5, wherein the positioning ribs have a cross-sectional shape selected from the group consisting of a semicircular shape, a square shape, and a half-oval shape.

9. The heat sink protective cover as claimed in claim 6, wherein the positioning ribs have a cross-sectional shape selected from the group consisting of a semicircular shape, a square shape, and a half-oval shape.

* * * * *